(12) United States Patent
Pistorius et al.

(10) Patent No.: US 7,804,325 B1
(45) Date of Patent: Sep. 28, 2010

(54) DEDICATED FUNCTION BLOCK INTERFACING WITH GENERAL PURPOSE FUNCTION BLOCKS ON INTEGRATED CIRCUITS

(75) Inventors: Erhard Joachim Pistorius, Mountain View, CA (US); Michael D. Hutton, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 24 days.

(21) Appl. No.: 12/148,877

(22) Filed: Apr. 22, 2008

(51) Int. Cl.
*H03K 19/173* (2006.01)
(52) U.S. Cl. .............................. 326/38; 326/41; 326/47
(58) Field of Classification Search ............ 326/37–41, 326/47
See application file for complete search history.

(56) References Cited

U.S. PATENT DOCUMENTS

| | | | | | |
|---|---|---|---|---|---|
| 4,963,770 | A | * | 10/1990 | Keida | 326/40 |
| 5,338,984 | A | * | 8/1994 | Sutherland | 326/41 |
| 5,371,422 | A | * | 12/1994 | Patel et al. | 326/41 |
| 5,455,525 | A | * | 10/1995 | Ho et al. | 326/41 |
| 5,537,057 | A | * | 7/1996 | Leong et al. | 326/41 |
| 5,598,109 | A | * | 1/1997 | Leong et al. | 326/41 |
| 5,682,107 | A | * | 10/1997 | Tavana et al. | 326/41 |
| 6,215,326 | B1 | * | 4/2001 | Jefferson et al. | 326/41 |
| 6,362,650 | B1 | * | 3/2002 | New et al. | 326/41 |
| 6,980,026 | B1 | * | 12/2005 | Trimberger | 326/40 |
| 7,084,664 | B1 | * | 8/2006 | Lee et al. | 326/38 |
| 7,142,012 | B2 | * | 11/2006 | Ting | 326/41 |
| 7,268,584 | B1 | * | 9/2007 | Cashman et al. | 326/39 |
| 7,467,175 | B2 | * | 12/2008 | Simkins et al. | 708/523 |
| 2006/0075012 | A1 | * | 4/2006 | Minz et al. | 708/490 |

* cited by examiner

*Primary Examiner*—James H. Cho
*Assistant Examiner*—Jason Crawford
(74) *Attorney, Agent, or Firm*—Ropes & Gray LLP; Robert R. Jackson

(57) ABSTRACT

To improve interfacing between a block of dedicated function circuitry and blocks of more general purpose circuitry on an integrated circuit ("IC"), signals that are to be output by the dedicated function block are routed internally in that block so that they go into interconnection circuitry on the IC for more efficient application by that interconnection circuitry to the general purpose circuitry. Some of this routing internal to the dedicated function block may be controllably variable. The routing internal to the dedicated function block may also be arranged to take advantage of "sneak" connections that may exist between the dedicated function block and the general purpose blocks.

14 Claims, 6 Drawing Sheets

DEDICATED FUNCTION BLOCK INTERFACING WITH GENERAL PURPOSE FUNCTION BLOCKS ON INTEGRATED CIRCUITS

BACKGROUND OF THE INVENTION

This invention relates to integrated circuits, and more particularly to integrated circuits having at least one block that is dedicated to performing particular kinds of functions (such as digital signal processing ("DSP") functions), and other blocks of a more general purpose nature (e.g., general purpose programmable logic blocks).

In integrated circuits of the type described above, the dedicated function block may be physically relatively large compared to one of the general purpose blocks. For example, ten general purpose circuit modules may form a so-called logic array block ("LAB"), and four rows of LABs may be interrupted by one dedicated function block. A dedicated function block may output 72 data signals in parallel, and assuming that each general purpose circuit module can further process two of these signals, then the 40 general purpose circuit modules that are adjacent to the dedicated function block in the four LAB rows that are interrupted by that block have enough capacity to further process all of the output signals of the dedicated block. However, this can necessitate extensive use not only of so-called horizontal interconnection conductor resources between the dedicated and general purpose blocks, but also use of so-called vertical interconnection conductors disposed in that same general area. The vertical conductors may need to be used to shift some of the dedicated block outputs from where they come out of that block adjacent one of the LAB rows to adjacency with another LAB row that they need to enter for further processing. Having to route some dedicated block outputs through vertical interconnection conductors can slow down this transfer of information from the dedicated block to the general purpose blocks. It would be desirable to reduce or eliminate such signal propagation delay.

SUMMARY OF THE INVENTION

In accordance with certain aspects of the invention, an integrated circuit may include a dedicated function block having first and second pluralities of output terminals. The integrated circuit may further include first and second general purpose blocks having respective first and second pluralities of input terminals. The integrated circuit may still further include interconnection circuitry for conveying signals from the output terminals to the input terminals in any of a plurality of different patterns, more resources of the interconnection circuitry being required to make a connection from a first output to a second input or from a second output to a first input than from a first output to a first input or from a second output to a second input. The integrated circuit may yet further include routing circuitry internal to the dedicated function block for selectively directing all signals of the dedicated function block that are to be further processed by the first general purpose block to the first plurality of output terminals.

In addition to the foregoing, the above-mentioned routing circuitry may be able to selectively direct all signals of the dedicated function block that are to be further processed by the second general purpose block to the second plurality of output terminals.

In certain embodiments, the dedicated function block produces signals indicative of first and second products of respective first and second multiplications. In such embodiments, the above-mentioned routing circuitry may direct signals indicative of first portions of each of the first and second products to the first plurality of output terminals, and it may direct signals indicative of second portions of each of the first and second products to the second plurality of output terminals. As a possible further refinement, the above-mentioned routing circuitry may further direct signals indicative of lower order bits of the first portions to a predetermined subplurality of the first plurality of output terminals. Each output terminal in the above-mentioned subplurality may have a respective "sneak" connection in the above-mentioned interconnection circuitry that is usable only to connect to the first input terminals. This feature may also be duplicated for lower order bits of the second portions. In other words, lower order bits of the second portions may be directed by the routing circuitry to a predetermined subplurality of the second plurality of output terminals. This subplurality of output terminals have sneak connections that can only be used to connect to the second input terminals. A sneak connection typically bypasses at least some configurable components of the above-mentioned interconnection circuitry, thereby rendering sneak connections faster than other, more general purpose connections through the interconnection circuitry.

Further features of the invention, its nature and various advantages, will be more apparent from the accompanying drawings and the following detailed description.

DETAILED DESCRIPTION

Figure 1:
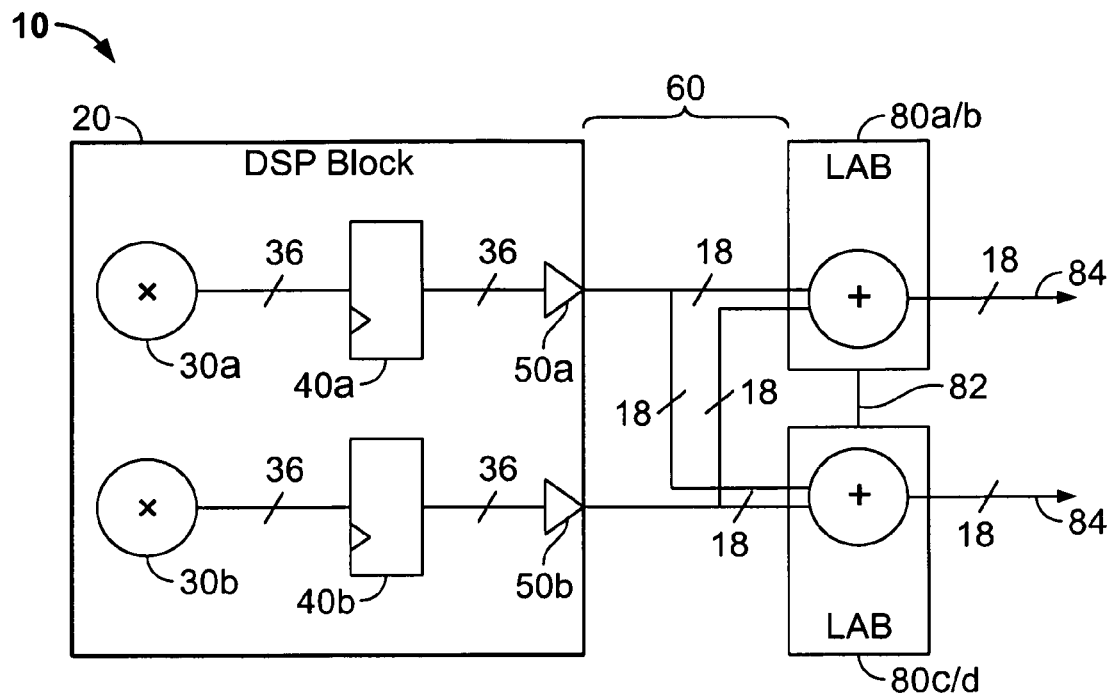
FIG. 1 is a simplified schematic block diagram showing illustrative prior art circuitry that can be background for the present invention.

FIG. 1 shows illustrative prior art circuitry 10 that it is useful by way of further background for the invention. Circuitry 10 is on an integrated circuit. (This is also true for the circuitry shown in each of the subsequently described FIGS.) Circuitry 10 includes dedicated function block 20 (which, in the depicted illustrative circuitry, is digital signal processing ("DSP") circuitry). Circuitry 20 is shown as including two 18-by-18 ("18×18") multipliers 30a and 30b. Each of these multipliers 30 is capable of multiplying together two data words of up to 18 data bits each to produce a product data word of up to 36 bits. Circuitry 20 further includes two banks of registers (e.g., flip-flops) 40a and 40b for registering the outputs of multipliers 30$a$ and 30$b$, respectively. Output driver banks 50$a$ and 50$b$ are provided for driving the output signals of registers 40 out of dedicated function block 20 onto interconnection conductor resources 60 of the integrated circuit.

Circuitry 20 is called a dedicated function block because it is dedicated to performing only certain kinds of functions. In the depicted case, circuitry 20 is dedicated to performing multiplications of the kind that are typically needed in DSP operations (e.g., digital filtering and the like). Some aspects of the operation of circuitry 20 may be variable (e.g., programmably modifiable or selectable) in some respects. But to at least a large extent, the functions of circuitry 20 are predetermined by its construction. It is not general purpose circuitry in any broad sense of that term.

Circuitry 60 routes the output signals of circuitry 20 to other circuitry on the integrated circuit. In the configuration shown in FIG. 1, circuitry 60 is shown routing the output signals of circuitry 20 to blocks of general purpose circuitry 80 that are adjacent to one side of circuitry 20. In the FIG. 1 example, this general purpose circuitry 80 is general purpose logic circuitry (e.g., logic circuitry that is programmable to perform any of a wide range of logic functions.) FIG. 1 shows a column of two blocks of such circuitry. This is a simplification of a particular embodiment in which each of these blocks represents two smaller blocks (e.g., two LABs in the parlance employed in the Background section of this specification), one above the other. To indicate this, the upper block in FIG. 1 is labelled 80$a/b$, and the lower block in FIG. 1 is labelled 80$c/d$.

Although blocks 80 are general purpose blocks that can be used to perform any of a wide range of further processing or operations on the output signals of circuitry 20 (or alternatively on other signals if desired), FIG. 1 shows blocks 80 performing a particular function that is frequently needed in DSP. This particular function is adding together the two products that are output by circuitry 20. Because each of blocks 80 has only enough capacity to add together some of the bits of the two 36-bit products output by circuitry 20, circuitry 60 is shown as routing 18 bits (of the same order (arithmetic or mathematical significance)) of each of the products to block 80$a/b$, while routing the other 18 bits of each product to block 80$c/d$. For example, the lower order bits may be routed to block 80$a/b$, and the higher order bits may be routed to block 80$c/d$. Link 82 is provided for carry signals between blocks 80. The sum of the two 36-bit products is output by blocks 80 on leads 84.

Figure 4:
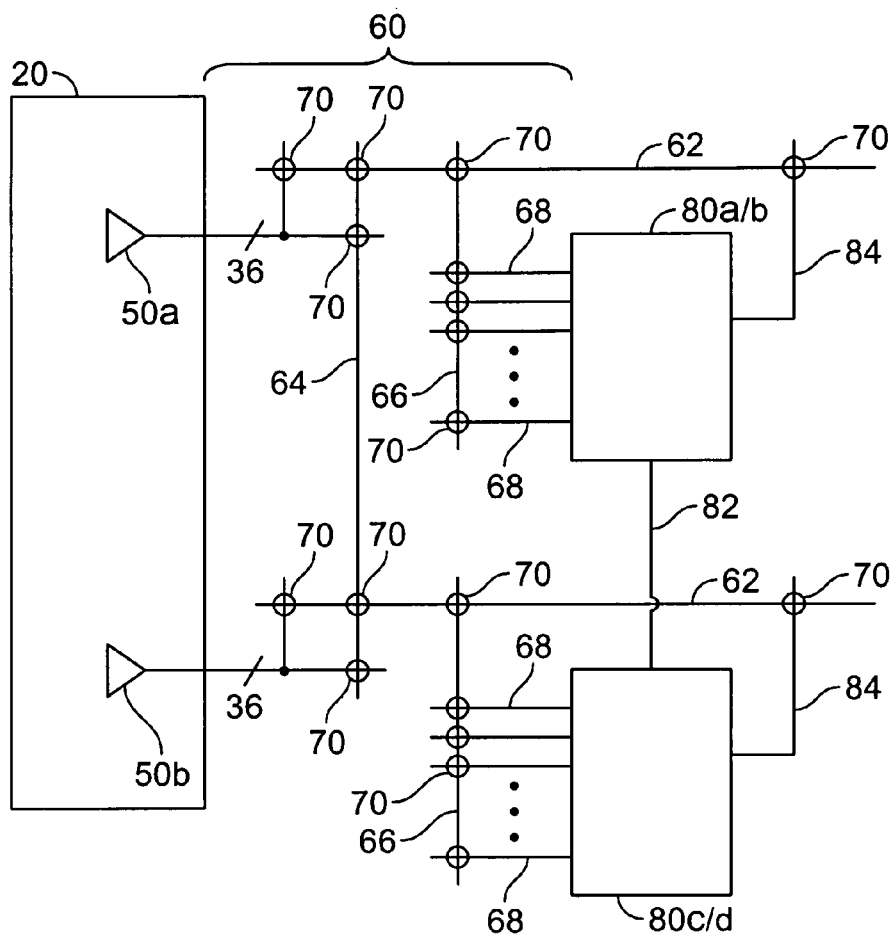
FIG. 4 shows an illustrative embodiment of portions of circuitry like that shown in FIGS. 1-3 in some more detail.

Although FIG. 1 may suggest that interconnection conductor resources 60 have a fixed or predetermined configuration, that is not in fact the case. Rather, as shown in FIG. 4, such resources are typically programmable or configurable to a significant extent. In the illustrative embodiment shown in FIG. 4, interconnection resources 60 include so-called horizontal interconnection conductors 62 that extend horizontally along and adjacent to rows of functional circuitry like 80. Resources 60 also include so-called vertical interconnection conductors 64 that extend vertically along and adjacent to columns of functional circuitry like 80. So-called LAB line conductors 66 are usually associated with each block of functional circuitry like 80 (but can also span more than one LAB as shown in FIG. 4) and can be used to help bring selected signals from the adjacent horizontal conductors 62 to the associated block. Logic element input conductors 68 can be used to bring signals from the LAB line conductors 66 of a block to particular inputs of particular logic elements in that block. The open circles 70 at the intersections of various types of conductors represent locations at which connections can be made or not made between selected ones of the conductors intersecting at that location. For example, these connections 70 may be programmable with respect to whether or not they are made. Many of the lines shown in FIG. 4 actually represent multiple, generally parallel conductors. Similarly, the open circles 70 in FIG. 4 typically represent many possible (selectable) conductor interconnections.

Assuming that resources 60 in FIG. 1 are actually constructed as shown in FIG. 4, then the routing for the lower order bits from the upper product output by circuitry 20 to circuitry 80$a/b$ is via the following path elements: 70, 62, 70, 66, 70, 68. The routing for the lower order bits from the lower product output by circuitry 20 to circuitry 80$a/b$ is via the following path elements: 70, 64, 70, 62, 70, 66, 70, 68. Note that this path is longer and includes more elements than the first-mentioned path. In particular, this latter path includes the use of vertical conductors 64, which the first-mentioned path does not need to employ.

Turning now to the higher order bits, the path for those bits from the upper product output by circuitry 20 to block 80$c/d$ includes the following elements: 70, 64, 70, 62, 70, 66, 70, 68. Note again the need to use vertical conductors 64 in this path. The path for the higher order bits from the lower product output by circuitry 20 to block 80$c/d$ includes the following elements: 70, 62, 70, 66, 70, 68. This path does not need to include vertical conductors 64.

From the foregoing, it will be seen that the circuit construction shown in FIG. 1 requires the use of vertical conductors (64 in FIG. 4) in some (but not all) paths between circuitry 20 and circuitry 80. Paths that require more elements tend to be slower (in terms of signal propagation time) than paths that require fewer elements. The slowest path determines the speed at which the overall circuitry can be operated. It can therefore be desirable to reduce the number of elements required in signal paths. An illustrative embodiment in which this can be accomplished in accordance with this invention is shown in FIG. 2.

Figure 2:
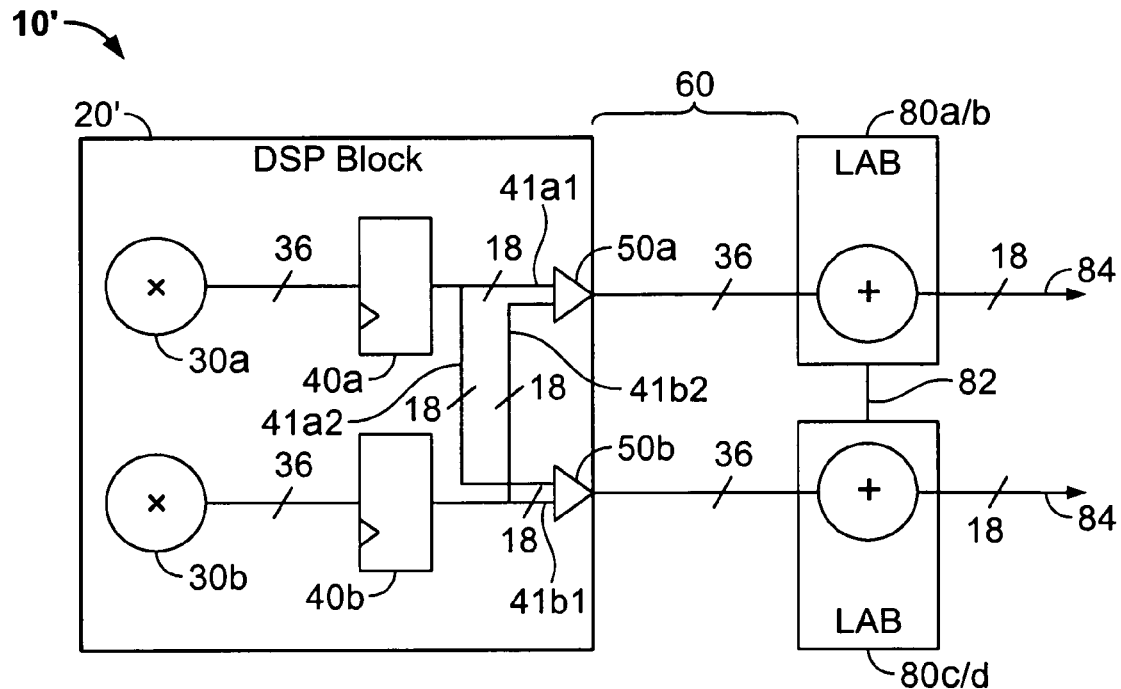
FIG. 2 is generally similar to FIG. 1, but shows an illustrative embodiment of certain aspects of the invention.

In FIG. 2 elements that are the same as elements in FIG. 1 have the same reference numbers in both FIGS. Elements in FIG. 2 that are modified as compared to their approximate counterparts in FIG. 1 have the same reference numbers in both FIGS., but with a prime in FIG. 2 to indicate the FIG. 2 modification. For the most part, it will only be necessary to describe how FIG. 2 has been changed from FIG. 1. The other (unchanged) aspects of FIG. 2 are covered by the earlier description of FIG. 1 and therefore do not need to be described again.

In FIG. 2 the 18 higher order bits from registers 40$a$ are routed via conductors 41$a$2 inside circuitry 20 from registers 40$a$ to output drivers 50$b$. Similarly, the 18 lower order bits from registers 40$b$ are routed via conductors 41$b$2 inside circuitry 20 from registers 40$b$ to output drivers 50$a$. This new routing inside circuitry 20 puts all of the lower order bits of both of the products produced by circuitry 20 through output drivers 50$a$. Similarly, this new circuitry 20 routing puts all of the higher order bits of both of the products produced by circuitry 20 through output drivers 50$b$. Output drivers 50$a$ are the drivers that can drive the horizontal conductors 62 (FIG. 4) that can be used to reach block 80$a/b$ without the need to use any vertical conductors 64. Similarly, output drivers 50$b$ are the drivers that can drive the horizontal conductors 62 that can be used to reach block 80$c/d$ without the need to use any vertical conductors 64. Accordingly, with the construction shown in FIG. 2, all lower order bits can flow from circuitry 20 to circuitry 80$a/b$ through interconnection conductor resources 60 without the need to use any vertical conductors 64. Similarly, with the construction shown in FIG.

2, all higher order bits can flow from circuitry 20 to circuitry 80c/d through interconnection conductor resources 60 without the need to use any vertical conductors 64. Avoiding the need to use vertical conductors 64 allows the construction shown in FIG. 2 to operate faster than the FIG. 1 construction when performing the same function.

Figure 5:
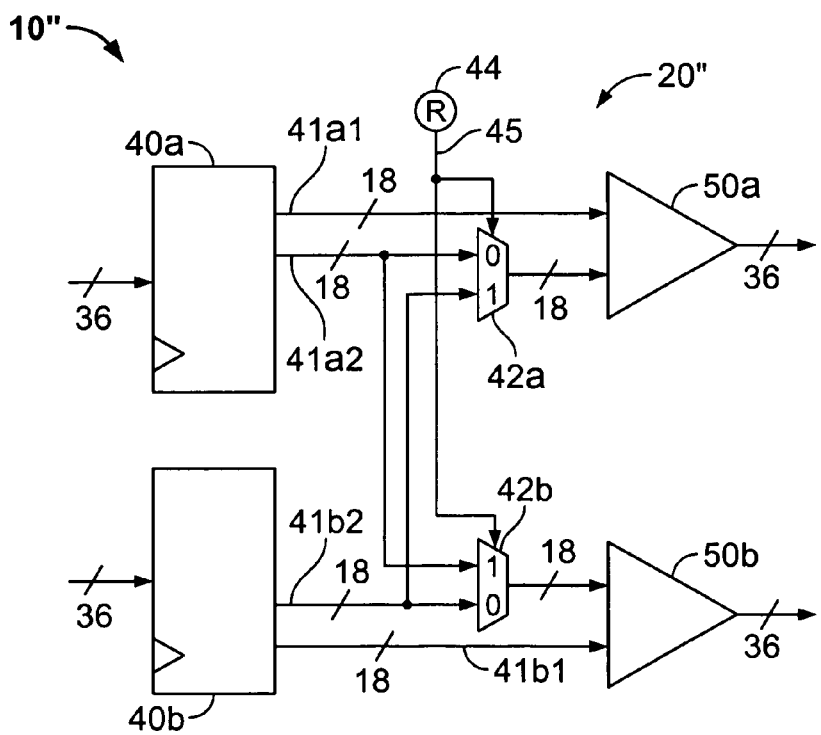
FIG. 5 is a simplified schematic block diagram of an illustrative embodiment of possible additions to what is shown in FIG. 2 or FIG. 3 in accordance with further possible aspects of the invention.

FIG. 5 shows an illustrative embodiment of possible modification of circuitry 20' (now numbered 20") in accordance with a further possible aspect of the invention. In FIG. 5 the 18 lower order bits output by registers 40b are applied to a first set of selectable inputs to multiplexer ("mux") 42a, and also to a'first set of selectable inputs to mux 42b. The 18 higher order bits output by registers 40a are applied to a second set of selectable inputs to mux 42a and to a second set of selectable inputs to mux 42b. Each of muxes 42 is controllable by a selection control signal 45 to select either one of its two sets of selectable inputs to be its output signals (applied to half of the output drivers in the associated set of output drivers 50). In this way the output signals of output drivers 50a can be either (1) all of the output signals of registers 40a (i.e., one entire 36-bit product as in FIG. 1), or (2) all of the lower order bits from both products (as in FIG. 2). Similarly, the output signals of drivers 50b can be either (1) all of the output signals of registers 40b (i.e., another entire 36-bit product as in FIG. 1), or (2) all of the higher order bits from both products (as in FIG. 2). Selection control signal 45 may come from any suitable source (e.g., a programmable configuration random access memory element 44 on integrated circuit 10"). The modification shown in FIG. 5 gives circuitry like that shown in FIG. 2 the ability to alternatively output signals from dedicated function block 20' as though that block were constructed as shown in FIG. 1.

Figure 6:
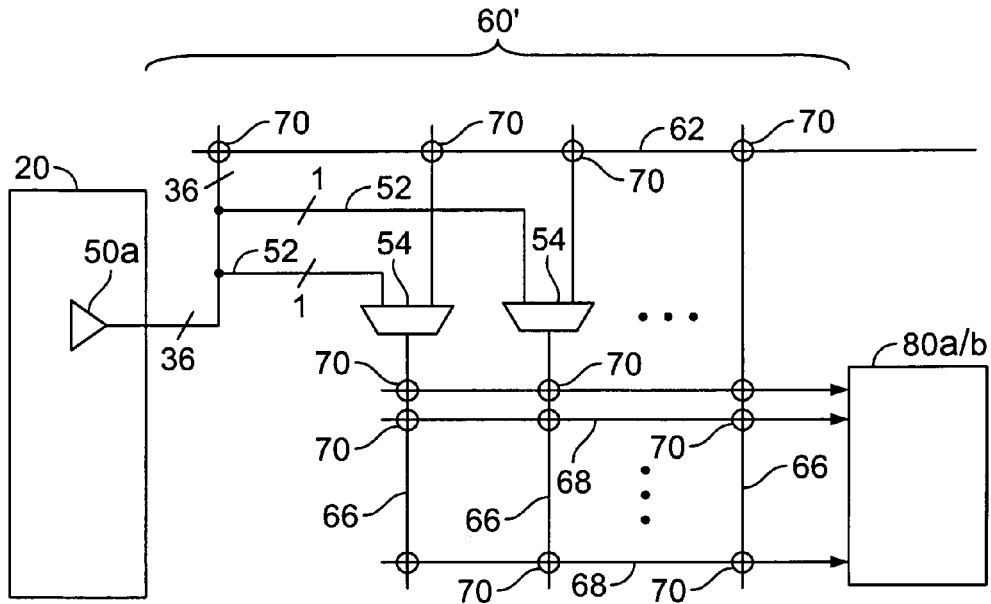
FIG. 6 is a simplified schematic block diagram of additional known circuitry that is provided as background for certain aspects of the invention.

FIG. 6 and the following description of that FIG. provide some background for a further possible aspect of the invention. FIG. 6 shows in some more detail a representative portion of what is shown in FIG. 4 for certain possible integrated circuit architectures. FIG. 6 shows that in some architectures the signals on some of LAB lines 66 may be selected by multiplexers ("muxes") 54 from either horizontal conductors 62 or from so-called "sneak" connections 52 from circuitry 20. For example, in addition to all 36 of the outputs of output drivers 50a being selectively connectable to horizontal conductors 62 via programmable connections 70, some of these driver outputs are connected more directly (via sneak conductors 52) to selectable inputs of muxes 54. The other selectable inputs of these muxes 54 can come from horizontal conductors 62 via programmable connections 70. Each mux 54 is controllable by a selection control signal (e.g., from circuitry like that shown at 44 and 45 in FIG. 5) to select either of its selectable inputs to be the signal it applies to the associated LAB line 66. Accordingly, the outputs of some of drivers 50a can get to LAB lines 66 via routing 52 and 54, as an alternative to routing 70, 62, 70, and 54. The former routing (52/54) can be made faster because it involves fewer elements and because it avoids using general purpose horizontal conductors 62, which tend to be more heavily loaded because of their greater length and larger number potential connection sites 70. In other words, sneak connections like 52 bypass some of the configurable components like 62, 64, and 70 of interconnection circuitry or resources like 60'. It will be noted that sneak connections 52 are only usable to get signals from outputs of associated drivers 50a to inputs of general purpose block 80a/b (not to inputs of block 80c/d). (Similarly, sneak connections for drivers 50b only go to block 80c/d, not to block 80a/b.) Sneak connections like 52 may be included in a circuit architecture like 60' in FIG. 6 because there is room for them in the interconnection conductor track layout. If provided, they tend to be provided for only some of the outputs of each of output drivers 50.

Because the above-described sneak connections 52 tend to be faster than the alternative routing via horizontal conductors 62, overall circuit performance can benefit (in uses like those shown in FIGS. 1 and 2) from using these sneak connections for the lower order outputs from each of drivers 50a and 50b. This benefit comes from the fact that the lower order bits are at or closer to the start of a ripple-carry or word-length-dependent (chain) function in the subsequent operation (e.g., in blocks 80). As such, each sneak path in bit-order improves the overall critical path length through the ripple or the like.

Figure 3:
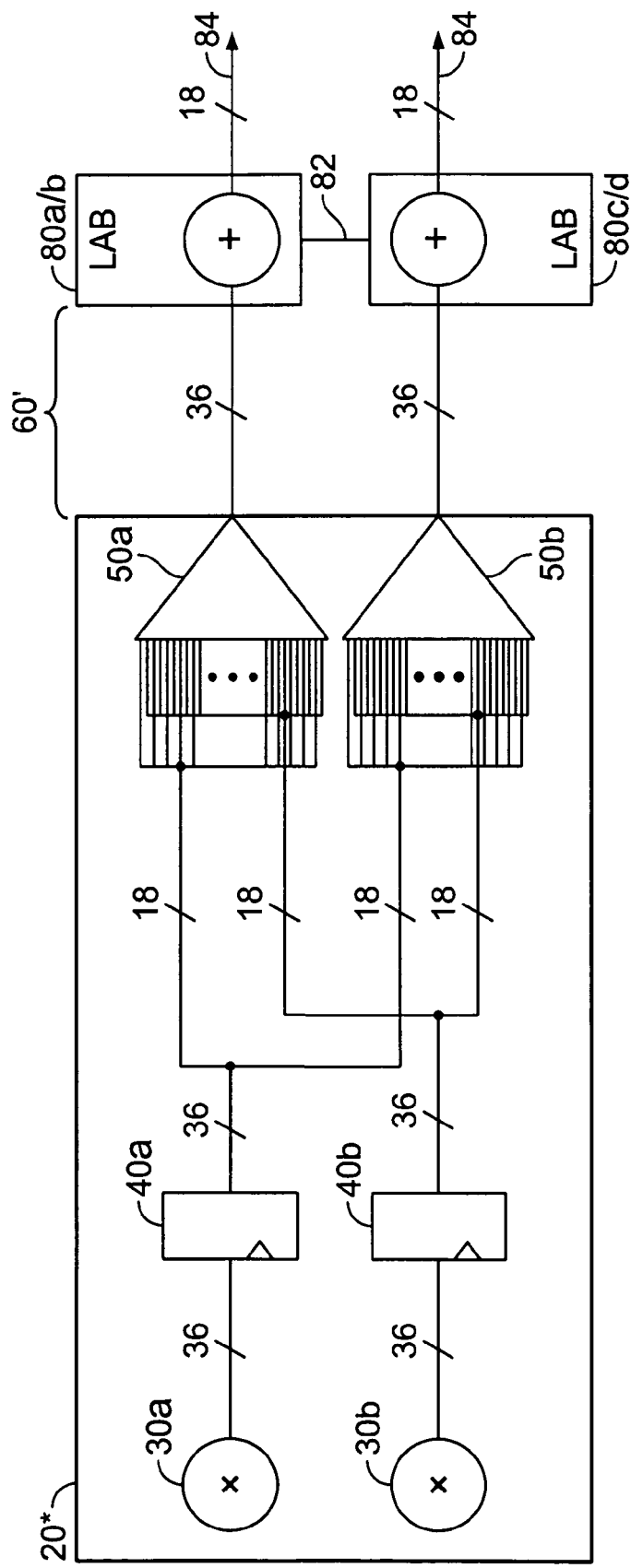
FIG. 3 is again generally similar to FIGS. 1 and 2, but shows an illustrative embodiment of certain further possible aspects of the invention.

In FIG. 3 the output from registers 40a that are going to output drivers 50a are interleaved with the outputs from registers 40b going to those output drivers. Moreover, the lowest order ones of these signals are routed to the ones of output drivers 50a whose outputs are connected to sneak connections 52. Suppose, for example, that the output drivers 50a that are connected to output terminals 0:17 are connected to sneak connections 52. Then register 40a output bits 0:8 may be connected, respectively, to the drivers 50a driving output terminals 0, 2, 4, 6, 8, 10, 12, 14, and 16. Register 40b output bits 0:8 may be connected, respectively, to the drivers 50a driving output terminals 1, 3, 5, 7, 9, 11, 13, 15, and 17. These lowest order bits can then get to block 80a/b via sneak connections 52. The other, higher order outputs of drivers 50a get to block 80a/b via the slower horizontal conductors 62. Ripple carry from adding the lower order bits can start sooner in block 8a/b because the sneak connections get these lower order bits to block 80a/b sooner than via conductors 62. This enables the ripple carry through all of block 80a/b to finish sooner, which is a benefit as described earlier.

The same interleaving and routing to sneak connections is used for output drivers 50b. Assume again that the output terminals 0:17 driven by some of output drivers 50b have sneak connections to block 80c/d. Then signals 18:26 output by registers 40a may be connected, respectively, to the drivers 50b driving output terminals 0, 2, 4, 6, 8, 10, 12, 14, and 16. Register 40b output bits 18:26 may be connected, respectively, to the drivers 50b driving output terminals 1, 3, 5, 7, 9, 11, 13, 15, and 17. These bits can then get to block 80c/d via sneak connections 52. The other, higher order outputs of drivers 50b get to block 80c/d via the slower horizontal conductors 62. As in block 80a/b, ripple carry from adding the (locally) lower order bits applied to block 80c/d can start sooner in that block because the sneak connections get these bits to block 80c/d sooner than via conductors 62. This speeds ripple carry through all of block 80c/d, which is again beneficial as described earlier.

If the adder arithmetic in LAB blocks 80 is not a ripple carry, but some other form of adder such as, for example, a carry look-ahead adder, a carry-select adder, or a carry-skip adder, then it might be preferable to interleave bits coming from registers 40a and 40b at the output terminals 50a and 50b in a different way. The actual interleaving depends on the adder architecture. Whatever the adder implementation, however, it is beneficial for the bits coming from registers 40a and 40b that are going to be on the critical path in the adder to have access to available sneak paths 52.

Figure 7:
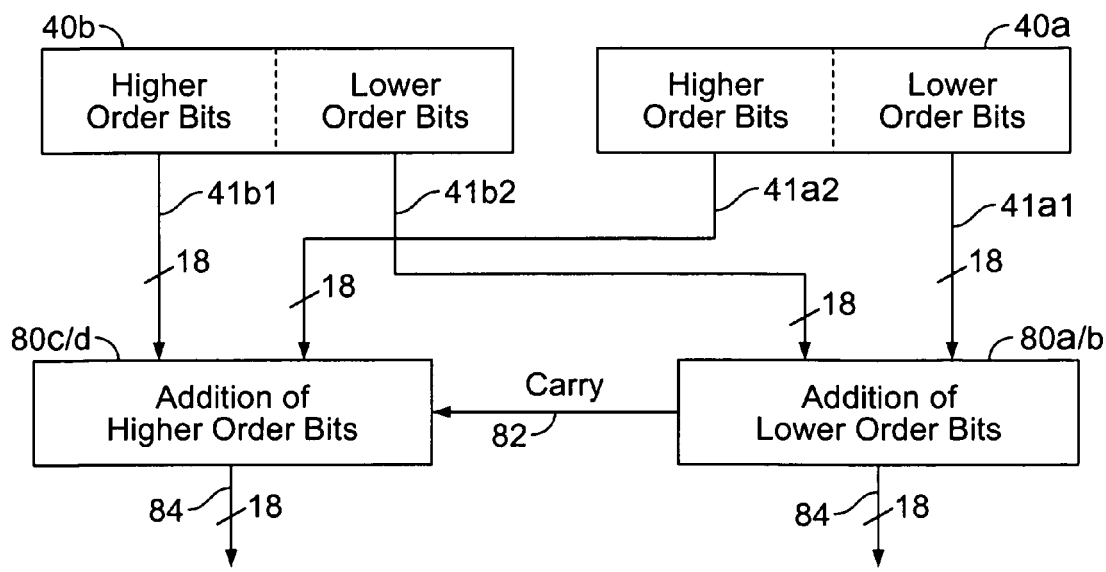
FIG. 7 is a simplified flow chart that is useful in explaining certain aspects of the invention.

FIG. 7 is provided to further illustrate what is meant by lower order bits and higher order bits, and to show how these various groups of bits flow and are handled in an operation like that shown in any of the other FIGS. (in which two 36-bit products are being added together). Again, lower order bits are bits having lower arithmetic or mathematical significance. Higher order bits are bits having higher arithmetic or mathematical significance.

Figure 8:
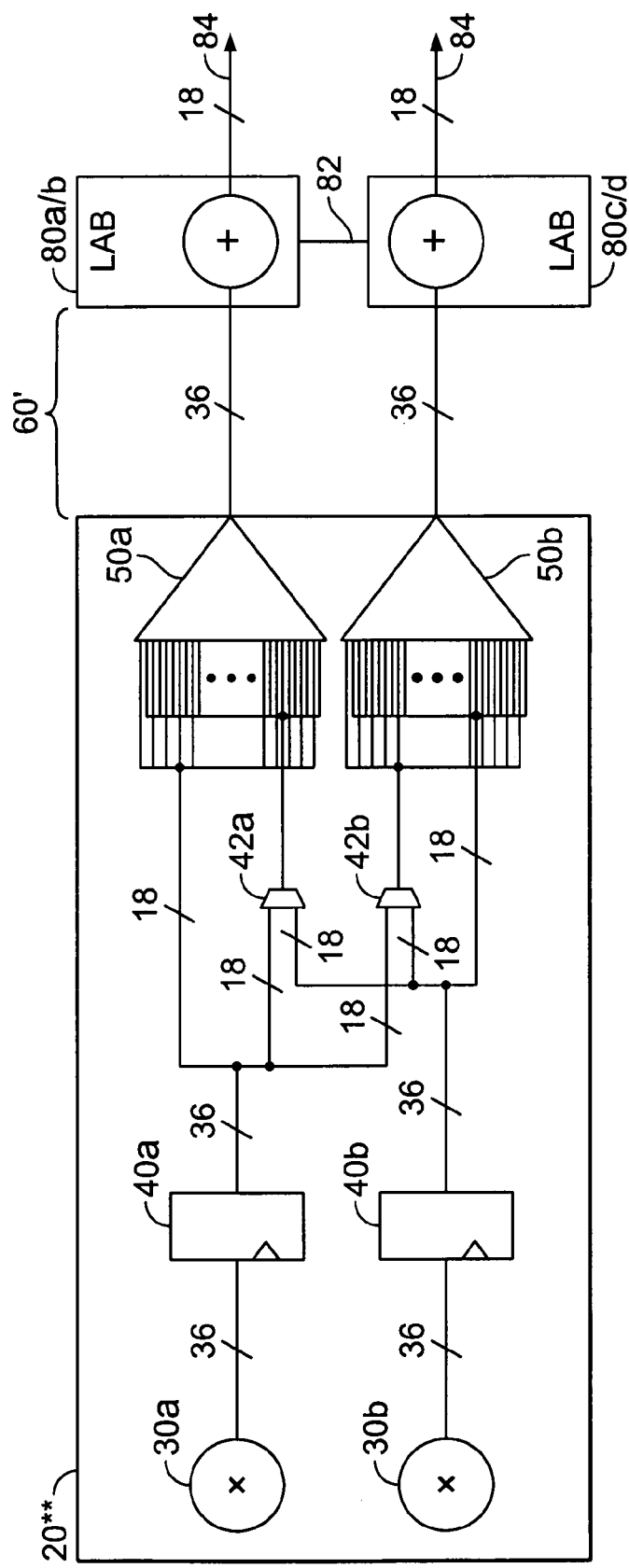
FIG. 8 is similar to FIG. 3 but with modifications like those shown in FIG. 5 added.

FIG. 8 is provided to show that the selectable routing feature (elements 42a and 42b) of FIG. 5 can be combined with the interleaving feature of FIG. 3.

Figure 9:
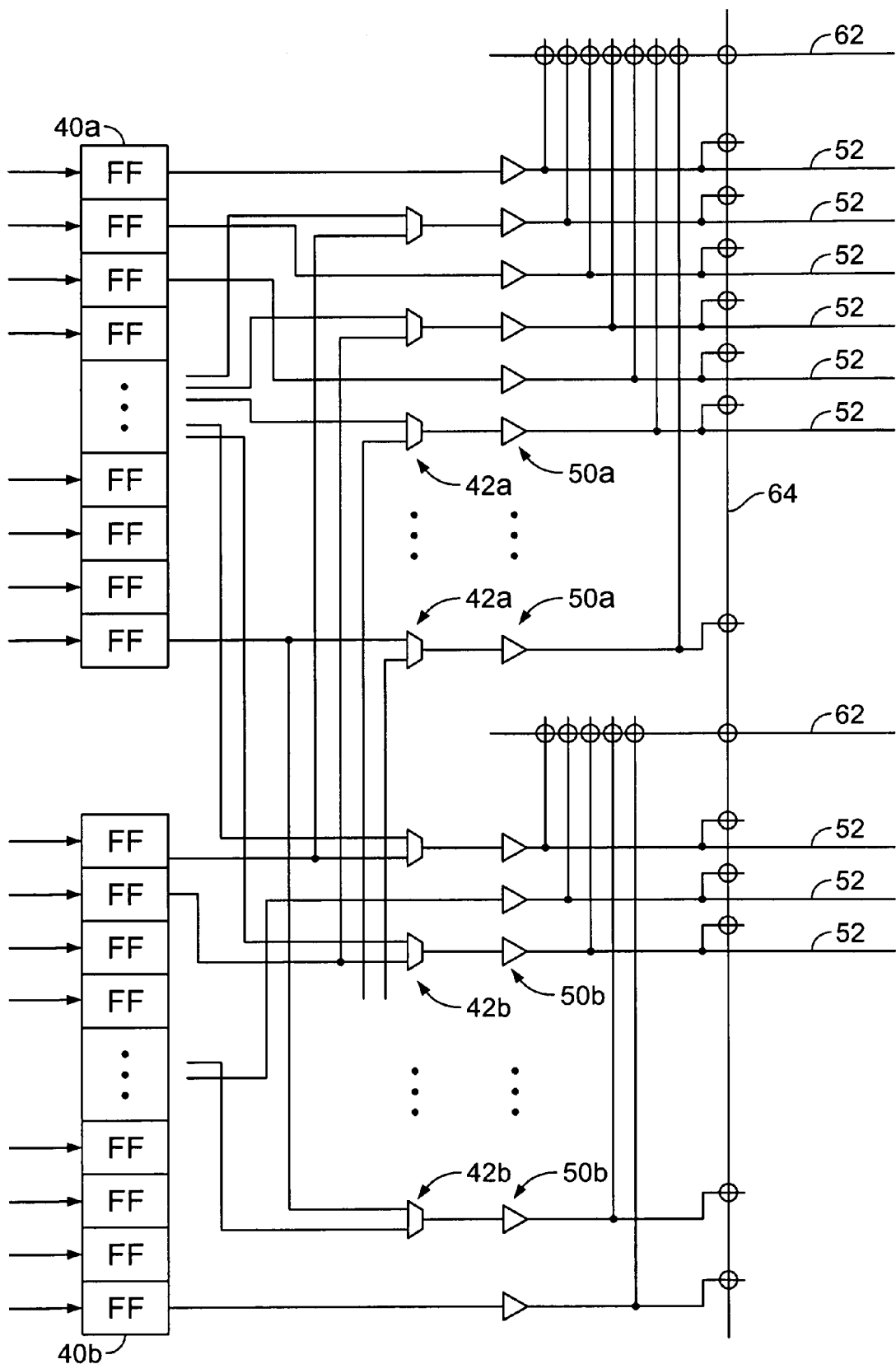
FIG. 9 shows representative portions of FIG. 8 in somewhat more detail.

FIG. 9 is a representative portion of FIG. 8 in somewhat more detail. A primary purpose of FIG. 9 is to make the point that elements like 40, 42, 50, etc. in all of the other FIGS. in this disclosure are actually collections of individual circuit components handling various signals separately in parallel. FIG. 9 also shows that only some of output drivers 50a typically have sneak connections 52 (to inputs of block 80a/b only), and similarly that only some of output drivers 50b typically have sneak connections 52 (to inputs of block 80c/d only).

It will be understood that the foregoing is only illustrative of the principles of the invention, and that various modifications can be made by those skilled in the art without departing from the scope and spirit of the invention. For example, the number of signals at different points in the depicted circuitries are only illustrative, and different numbers of such signals can be used instead if desired. Similarly, terms like "horizontal", "vertical", "row", "column", etc., are used only for convenience and not with the intention of limiting what is described to any particular absolute, fixed, orientations or directions. As another example of possible modifications, it will be understood that any of the circuit elements shown herein can be replicated any number of times on an integrated circuit in accordance with the invention.

The invention claimed is:

1. An integrated circuit comprising:
a dedicated function block having (1) first and second multiplier circuits for respectively producing first and second pluralities of signals indicative of products of first and second multiplications, and (2) first and second pluralities of output terminals;
first and second general purpose blocks having respective first and second pluralities of input terminals;
interconnection circuitry that is configurable to connect the output terminals to the input terminals with any of a plurality of different routings, the interconnection circuitry including (1) first interconnection circuitry that is sufficient to make connections between the first output and first input terminals but not between the second output and first input terminals, and (2) second interconnection circuitry that must be used to make connections between the second output and first input terminals; and
routing circuitry internal to the dedicated function block for routing a first subplurality of each of the first and second pluralities of signals to the first output terminals, and for routing a second subplurality of each of the first and second pluralities of signals to the second output terminals;
wherein the interconnection circuitry further includes sneak connections from a subplurality of the first output terminals that are usable only to apply signals from the subplurality of the first output terminals to the first input terminals, and wherein the routing circuitry internal to the dedicated function block includes routing, to the subplurality of the first output terminals, signals that are needed by early stages of signal processing chains in the first general purpose block.

2. The integrated circuit defined in claim 1 wherein the routing circuitry comprises:
controllable routing circuitry for selectively substituting said second subplurality of said first plurality of signals for said first subplurality of said second plurality of signals that would otherwise be applied to some of the first output terminals.

3. The integrated circuit defined in claim 2 wherein said controllable routing circuitry comprises multiplexer circuitry.

4. The integrated circuit defined in claim 3 wherein said controllable routing circuitry further comprises programmable memory circuitry for controlling the multiplexer circuitry with respect to what signals the multiplexer circuitry passes.

5. An integrated circuit comprising:
a dedicated function block including first and second multiplier circuits for respectively producing first and second pluralities of signals indicative of products of first and second multiplications;
first and second general purpose blocks, each of which is configurable to add together no more than portions of the first and second products;
interconnection circuitry that is configurable to apply output signals of the dedicated function block to the general purpose blocks with any of a plurality of different routings, routings from first and second pluralities of output terminals of the dedicated function block to the first and second general purpose blocks, respectively, requiring fewer components of the interconnection circuitry than routings from the first and second pluralities of output terminals to the second and first general purpose blocks, respectively; and
routing circuitry internal to the dedicated function block for selecting between first and second routings of the signals indicative of the products to output terminals, the first routing applying the first and second products to the first and second pluralities of output terminals, respectively, and the second routing applying first portions of the first and second products to the first plurality of output terminals and second portions of the first and second products to the second plurality of output terminals;
wherein the interconnection circuitry includes first sneak connections from a subplurality of the first plurality of output terminals that are usable only to apply signals to the first general purpose block, and second sneak connections from a subplurality of the second plurality of output terminals that are usable only to apply signals to the second general purpose block.

6. The integrated circuit defined in claim 5 wherein the first portions are indicative of lower order bits of the first and second products, and wherein the second portions are indicative of higher order bits of the first and second products.

7. The integrated circuit defined in claim 5 wherein the routing circuitry comprises multiplexer circuitry.

8. The integrated circuit defined in claim 7 wherein the routing circuitry further comprises programmable memory circuitry for controlling the multiplexer circuitry with respect to what signals the multiplexer circuitry passes.

9. The integrated circuit defined in claim 5 wherein the second routing applies lower order bits of the first portions of the first and second products to the subplurality of the first plurality of output terminals.

10. The integrated circuit defined in claim 9 wherein the second routing applies lower order bits of the second portions of the first and second products to the subplurality of the second plurality of output terminals.

11. An integrated circuit comprising:
a dedicated function block having (1) first and second multiplier circuits for respectively producing signals indicative of first and second multiplication products, and (2) first and second pluralities of output terminals;

first and second general purpose blocks having respective first and second pluralities of input terminals;

interconnection circuitry for conveying signals from the output terminals to the input terminals in any of a plurality of different patterns, more resources of the interconnection circuitry being required to make a connection from a first output to a second input or from a second output to a first input than from a first output to a first input or from a second output to a second input; and routing circuitry internal to the dedicated function block for selectively directing signals indicative of first portions of each of the first and second products to the first plurality of output terminals;

wherein the routing circuitry further directs signals indicative of lower order bits of the first portions to a predetermined subplurality of the first plurality of output terminals; and wherein each of the subplurality of output terminals has a respective sneak connection in the interconnection circuitry that is usable only to connect to the first input terminals.

12. The integrated circuit defined in claim 11 wherein the routing circuitry is additionally able to selectively direct signals indicative of second portions of each of the first and second products to the second plurality of output terminals.

13. An integrated circuit comprising:

a dedicated function block including (1) first and second multiplier circuits for respectively producing first and second pluralities of signals indicative of first and second multiplication products, and (2) routing circuitry for selecting between (a) a first routing that applies the first and second products to first and second pluralities of output terminals of the dedicated function block, respectively, and (b) a second routing that applies first portions of the first and second products to the first plurality of output terminals and second portions of the first and second products to the second plurality of output terminals;

first and second general purpose blocks;

interconnection circuitry that is configurable to apply output signals of the dedicated function block to the general purpose blocks with any of a plurality of different routings, fewer components of the interconnection circuitry being required for routings from the first and second pluralities of output terminals to the first and second general purpose blocks, respectively, than for other routings from the output terminals to the general purpose blocks, the interconnection circuitry additionally including first sneak connections from a subplurality of the first plurality of output terminals that are usable only to apply signals to the first general purpose block.

14. The integrated circuit defined in claim 13 wherein the interconnection circuitry further includes second sneak connections from a subplurality of the second plurality of output terminals that are usable only to apply signals to the second general purpose block.

* * * * *